US012273115B2

(12) United States Patent
Chang et al.

(10) Patent No.: US 12,273,115 B2
(45) Date of Patent: Apr. 8, 2025

(54) DUAL MODE PHASE-LOCKED LOOP CIRCUIT, OSCILLATOR CIRCUIT, AND CONTROL METHOD OF OSCILLATOR CIRCUIT

(71) Applicant: M31 TECHNOLOGY CORPORATION, Hsinchu County (TW)

(72) Inventors: Ching-Hsiang Chang, Hsinchu (TW); Yu-Hsun Chien, Hsinchu (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 18/632,006

(22) Filed: Apr. 10, 2024

(65) Prior Publication Data
US 2024/0297652 A1   Sep. 5, 2024

Related U.S. Application Data

(63) Continuation of application No. 17/355,180, filed on Jun. 23, 2021, now Pat. No. 11,984,899.
(Continued)

(51) Int. Cl.
*H03L 7/08* (2006.01)
*H03K 3/037* (2006.01)
(Continued)

(52) U.S. Cl.
CPC ........... *H03L 7/0807* (2013.01); *H03K 3/037* (2013.01); *H03L 7/0893* (2013.01); *H03L 7/091* (2013.01);
(Continued)

(58) Field of Classification Search
CPC ..... H03L 7/0893; H03L 7/0895; H03L 7/099; H03L 7/0991; H03L 7/0992; H03L 7/0993
See application file for complete search history.

(56) References Cited

U.S. PATENT DOCUMENTS

| 7,990,225 B1 | 8/2011 | Guo et al. | |
| 8,090,755 B1 * | 1/2012 | Old | G06F 1/0328 708/271 |

(Continued)

OTHER PUBLICATIONS

Notice of References Cited in Notice of Allowance of U.S. Appl. No. 18/429,890.

*Primary Examiner* — Diana J. Cheng
(74) *Attorney, Agent, or Firm* — WPAT, P.C.; Anthony King

(57) ABSTRACT

A phase-locked loop circuit includes a phase frequency detector (PFD) circuit, a digital code generator circuit, a frequency divider and an oscillator circuit. The PFD circuit is configured to detect a difference in phase and frequency between a reference clock and a feedback clock to generate a first control signal and a second control signal. The digital code generator circuit is configured to process the second control signal to generate a digital code. The frequency divider is configured to receive an output clock to generate the feedback clock. The oscillator circuit is configured to generate the output clock according to the first control signal and the digital code. A frequency of the output clock is determined according to a first control parameter and a second control parameter of different types. The first and second control parameters are adjusted in response to the first control signal and the digital code respectively.

20 Claims, 9 Drawing Sheets

Related U.S. Application Data

(60) Provisional application No. 63/043,068, filed on Jun. 23, 2020.

(51) Int. Cl.
    *H03L 7/089*       (2006.01)
    *H03L 7/091*       (2006.01)
    *H03L 7/099*       (2006.01)
    *H03L 7/189*       (2006.01)
    *H03M 1/38*       (2006.01)

(52) U.S. Cl.
    CPC .......... *H03L 7/0992* (2013.01); *H03L 7/0995* (2013.01); *H03L 7/189* (2013.01); *H03M 1/38* (2013.01)

(56) References Cited

U.S. PATENT DOCUMENTS

| | | | | |
|---|---|---|---|---|
| 8,334,725 B2* | 12/2012 | Wang | ........................ | H03L 9/00 |
| | | | | 331/10 |
| 8,717,802 B2* | 5/2014 | Lam | ..................... | G11C 13/003 |
| | | | | 365/148 |
| 9,413,387 B2* | 8/2016 | Fenney | ................ | H03M 7/4006 |
| 9,813,069 B1* | 11/2017 | Chattopadhyay | ....... | H03L 7/099 |
| 10,833,684 B1 | 11/2020 | Bhagwan et al. | | |
| 2003/0132806 A1 | 7/2003 | Takenaka et al. | | |
| 2006/0285619 A1 | 12/2006 | Watanabe | | |
| 2009/0273405 A1 | 11/2009 | Cowan et al. | | |
| 2013/0187685 A1* | 7/2013 | Hong | ........................ | H03L 7/00 |
| | | | | 327/115 |
| 2015/0288368 A1* | 10/2015 | Yun | ........................ | H03L 7/103 |
| | | | | 331/18 |
| 2016/0142061 A1* | 5/2016 | Hung | ........................ | H03K 5/01 |
| | | | | 327/295 |
| 2016/0211967 A1* | 7/2016 | Huang | ................ | H03C 3/0933 |
| 2019/0372575 A1 | 12/2019 | Wu | | |

* cited by examiner

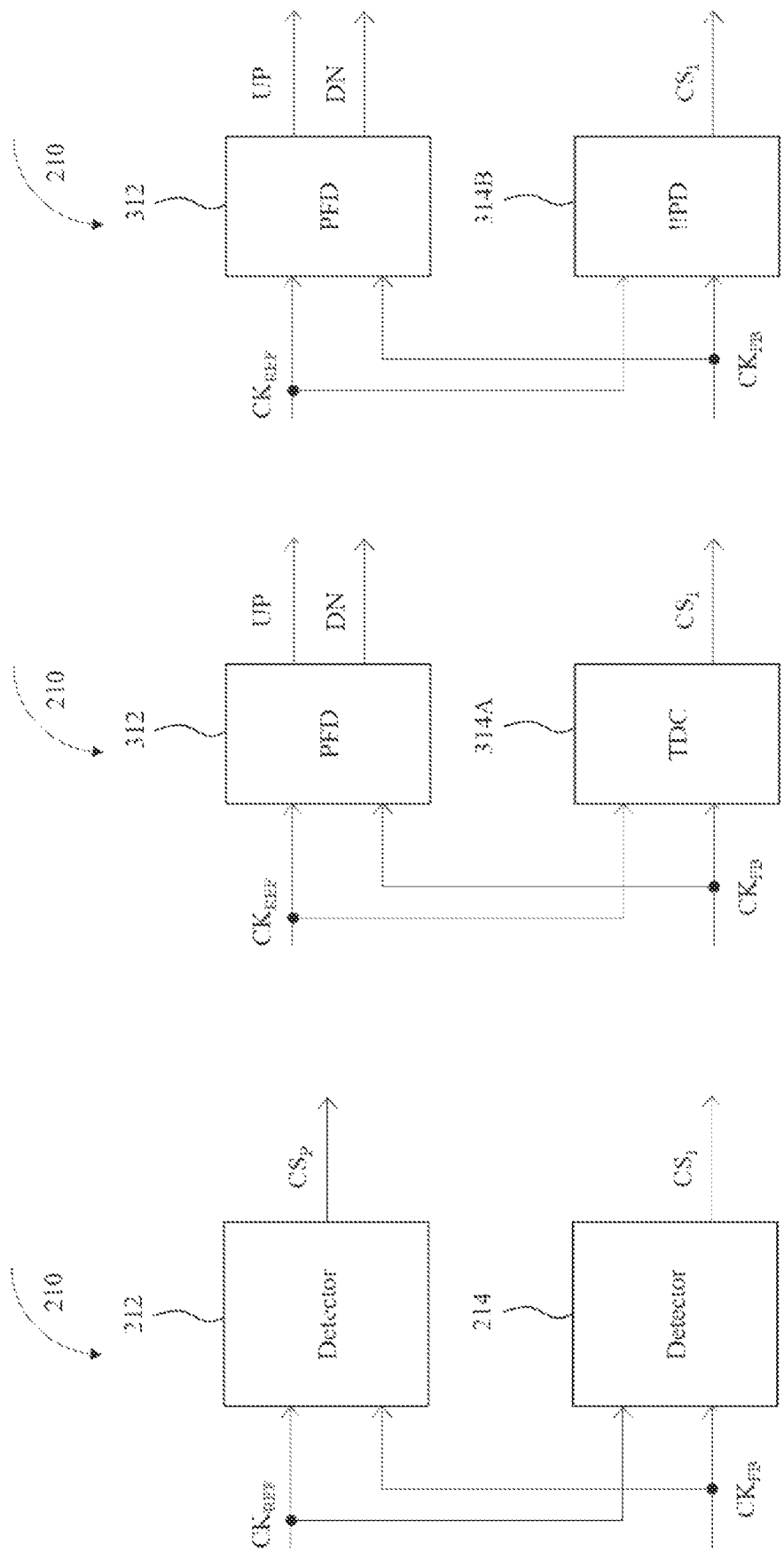

DUAL MODE PHASE-LOCKED LOOP CIRCUIT, OSCILLATOR CIRCUIT, AND CONTROL METHOD OF OSCILLATOR CIRCUIT

PRIORITY CLAIM AND CROSS-REFERENCE

The present application is a continuation of U.S. application Ser. No. 17/355,180 filed Jun. 23, 2021, which claims priority to U.S. Provisional Patent Application No. 63/043,068, filed on Jun. 23, 2020, each of which is incorporated by reference herein in its entirety.

BACKGROUND

The present disclosure relates to phase-locked loop (PLL) and, more particularly, to a PLL circuit which includes an oscillator circuit using a hybrid control scheme, and a related oscillator circuit and control method of an oscillator circuit.

Phase-locked loops are widely used in communication systems for clock synchronization, frequency demodulation, frequency synthesis, and clock and data recovery (CDR). Also, PLLs are incorporated into almost all high speed mixed-signal system-on-chips (SoCs). Several types of PLLs are proposed for various applications. For example, digital PLLs based wireless transceivers are popular in artificial intelligence, Internet of Things (IoT), and other computationally-intensive applications because of fast locking speed and low power consumption.

SUMMARY

The described embodiments provide a phase-locked loop circuit, which includes an oscillator circuit using a hybrid control scheme. The described embodiments further provide a related oscillator circuit, and a control method of an oscillator circuit.

Some embodiments described herein may include a phase-locked loop (PLL) circuit. The PLL circuit includes a phase frequency detector (PFD) circuit, a digital code generator circuit, a frequency divider and an oscillator circuit. The PFD circuit is configured to detect a difference in phase and frequency between a reference clock and a feedback clock to generate a first control signal and a second control signal. The digital code generator circuit, coupled to the PFD circuit, is configured to process the second control signal to generate a first digital code. The frequency divider, coupled to the PFD circuit, is configured to receive an output clock to generate the feedback clock. The oscillator circuit, coupled to the PFD circuit, the digital code generator circuit and the frequency divider, is configured to generate the output clock according to the first control signal and the first digital code. A frequency of the output clock is determined according to a first control parameter and a second control parameter of the oscillator circuit. The first control parameter and the second control parameter are different types of parameters, and adjusted in response to the first control signal and the first digital code respectively.

Some embodiments described herein may include an oscillator circuit. The oscillator circuit includes a current generator circuit and a signal generator circuit. The current generator circuit is configured to generate a current input according to a control signal. The signal generator circuit, coupled to the current generator circuit, is configured to enable a signal transmission path of a plurality of signal transmission paths according to a digital code, and generate an output clock by allowing the current input to flow through the signal transmission path. A frequency of the output clock is adjusted according to the current input and an electrical characteristic of the signal transmission path.

Some embodiments described herein may include a control method of an oscillator circuit. The control method includes: detecting a difference in phase and frequency between a reference clock and a feedback clock to generate a first control signal and a second control signal; processing the second control signal to generate a first digital code; applying the first control signal to the oscillator circuit to adjust a current input of the oscillator circuit; applying the first digital code to the oscillator circuit to allow the current input to flow through a signal transmission path, and accordingly generating an output clock, wherein a frequency of the output clock is adjusted according to the current input and an electrical characteristic of the signal transmission path; and dividing the frequency of the output clock to generate the feedback clock.

With the use of the proposed PLL control scheme, a PLL circuit can utilize a hybrid control oscillator and a hybrid PFD circuit to achieve low power consumption during phase-locking operations. Additionally, or alternatively, a PLL circuit can implement a free-running digitally controlled oscillator which exhibits high immunity against voltage and temperature variations. As a result, the proposed PLL control scheme can implement a dual mode PLL circuit to thereby save circuit area and reduce manufacturing costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 illustrates an implementation of the phase frequency detector circuit shown in FIG. 1 in accordance with some embodiments of the present disclosure.

FIG. 3A and FIG. 3B illustrate some implementations of the phase frequency detector circuit shown in FIG. 2 in accordance with some embodiments of the present disclosure.

DETAILED DESCRIPTION

Figure 1:
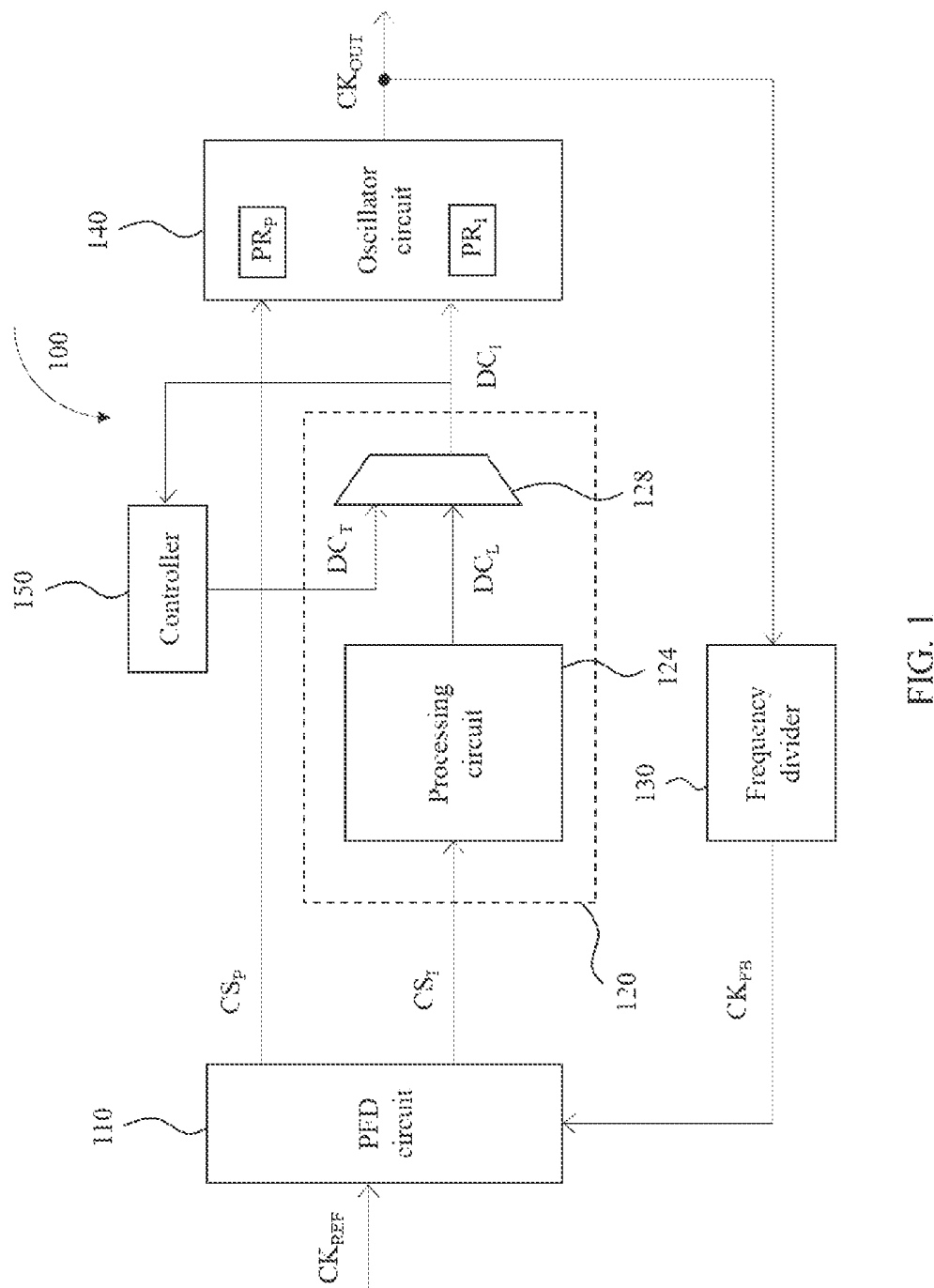
FIG. 1 is a block diagram illustrating an exemplary phase-locked loop circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, parameter values in the description that follows may vary depending on a given technology node. As another example, parameter values for a given technology node may vary depending on a given application or operating scenario. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

FIG. 1 is a block diagram illustrating an exemplary PLL circuit in accordance with some embodiments of the present disclosure. The PLL circuit 100 includes, but is not limited to, a phase frequency detector (PFD) circuit 110, a digital code generator circuit 120, a frequency divider 130 and an oscillator circuit 140. In the present embodiment, the PLL circuit 100 can be configured to operate in different modes of operation. For example, the PLL circuit 100 can be configured to operate in a PLL mode where an output clock $CK_{OUT}$ is locked according to a reference clock $CK_{REF}$. As another example, the PLL circuit 100 can be configured to operate in an oscillator mode to implement a free-running oscillator used for generating the output clock $CK_{OUT}$.

The PFD circuit 110 is configured to detect a difference in phase and frequency between the reference clock $CK_{REF}$ and a feedback clock $CK_{FB}$ to generate a plurality of control signals $CS_P$ and $CS_I$. The control signals $CS_P$ and $CS_I$ may be used for adjusting the output clock $CK_{OUT}$ in different manners. By way of example but not limitation, a phase and/or frequency of the output clock $CK_{OUT}$ can be adjusted in an analog/continuous manner according to the control signal $CS_P$, while the phase and/or frequency of the output clock $CK_{OUT}$ can be adjusted in a digital/discrete manner according to the control signal $CS_I$. The PFD circuit 110 may be referred to as a hybrid PFD circuit whose output can be used for hybrid control, e.g. analog and digital control, of the output clock $CK_{OUT}$.

In the present embodiment, the control signal $CS_P$ and the control signal $CS_I$ can be implemented to indicate a magnitude and a sign of a phase difference between the reference clock $CK_{REF}$ and the feedback clock $CK_{FB}$, respectively. A pulse width of the control signal $CS_P$ may change in response to the magnitude of the phase difference between the reference clock $CK_{REF}$ and the feedback clock $CK_{FB}$. A pulse width of the control signal $CS_I$ may be equal to a clock cycle of the reference clock $CK_{REF}$.

For example, the control signal $CS_P$ may include a set of error signals indicating a phase difference between the $CK_{REF}$ and the feedback clock $CK_{FB}$. An error signal, included in the set of error signals, at a predetermined logic level may represent that the feedback clock $CK_{FB}$ leads the reference clock $CK_{REF}$, wherein the pulse width of the error signal may be proportional to a phase angle by which the feedback clock $CK_{FB}$ leads the reference clock $CK_{REF}$. Another error signal, included in the set of error signals, at a predetermined logic level may represent that the feedback clock $CK_{FB}$ lags the reference clock $CK_{REF}$, wherein the pulse width of the another error signal may be proportional to a phase angle by which the feedback clock $CK_{FB}$ lags the reference clock $CK_{REF}$. As another example, the control signal $CS_I$ at a predetermined logic level may indicate that the feedback clock $CK_{FB}$ is faster or slower than the reference clock $CK_{REF}$.

The implementation of the control signals $CS_P$ and $CS_I$ described above is provided for illustrative purposes, and is not intended to limit the scope of the present disclosure. In some embodiments, the control signal $CS_P$ can indicate a phase difference between the reference clock $CK_{REF}$ and the feedback clock $CK_{FB}$, wherein a pulse width of the control signal $CS_P$ may change in response to a magnitude of the phase difference. The control signal $CS_I$ can indicate a frequency difference between the reference clock $CK_{REF}$ and the feedback clock $CK_{FB}$, wherein a pulse width of the control signal $CS_I$ may be equal to a clock cycle of the reference clock $CK_{REF}$. For example, a logic level of the control signal $CS_P$ may indicate whether the feedback clock $CK_{FB}$ leads or lag the reference clock $CK_{REF}$, wherein the pulse width of the control signal $CS_P$ may be proportional to a phase angle by which the feedback clock $CK_{FB}$ leads or lag the reference clock $CK_{REF}$. As another example, a logic level of the control signal $CS_I$ may indicate whether the feedback clock $CK_{FB}$ is faster or slower than the reference clock $CK_{REF}$.

The digital code generator circuit 120, coupled to the PFD circuit 110, is configured to process the control signal $CS_I$ to generate a digital code $DC_I$. By way of example but not limitation, the digital code generator circuit 120 may generate the digital code $DC_I$ by performing digital loop filtering operations upon the control signal $CS_I$. The digital loop filtering operations may include, but are not limited to, accumulation, integration and differentiation. As another example, the digital code generator circuit 120 may perform other digital signal processing operations upon the control signal $CS_I$ to generate the digital code $DC_I$. In the present embodiment, the control signal $CS_I$ may be a digital signal, such as a one-bit digital signal indicating a sign of a frequency difference or a sign of a phase difference between the reference clock $CK_{REF}$ and the feedback clock $CK_{FB}$. The digital code $DC_I$ may be an M-bit digital signal, where M may be an integer greater than one.

The frequency divider 130, coupled to the PFD circuit 110, is configured to receive the output clock $CK_{OUT}$ to generate the feedback clock $CK_{FB}$. In the present embodiment, the frequency divider 130 can divide a frequency of the output clock $CK_{OUT}$ by a division factor N, and accordingly generate the feedback clock $CK_{FB}$. The division factor N may be programmable or selectable.

The oscillator circuit 140, coupled to the PFD circuit 110, the digital code generator circuit 120 and the frequency divider 130, is configured to generate the output clock $CK_{OUT}$ according to the control signal $CS_P$ and the digital code $DC_I$. In the present embodiment, a frequency of the output clock $CK_{OUT}$ is determined according to different control parameters $PR_P$ and $PR_I$ of the oscillator circuit 140. The control parameters $PR_P$ and $PR_I$ are different types of parameters, such as different types of electrical parameters measured in different units of measurement. In addition, the control parameters $PR_P$ and $PR_I$ can be adjusted in response to the control signal $CS_P$ and the digital code $DC_I$ respectively. In other words, the control signal $CS_P$ and the digital code $DC_I$ can be used to adjust different types of control parameters which are measured in different units of measurement. The oscillator circuit 140 can be referred to as a hybrid control oscillator, whose output clock can be controlled by different types of control parameters.

By way of example but not limitation, the oscillator circuit 140 may be implemented using a relaxation oscillator. The frequency of the output clock $CK_{OUT}$ may be determined according to a current input of the oscillator circuit 140, and capacitance of a signal transmission path in the oscillator circuit 140 through which the current input flows. One of the control parameters $PR_P$ and $PR_I$ may be a magnitude of the current input, and the other may be the capacitance of the signal transmission path. As another example, the oscillator circuit 140 may be implemented using a ring oscillator. The frequency of the output clock $CK_{OUT}$ may be determined according to of a current input of the oscillator circuit 140, and a propagation delay of a delay chain in the oscillator circuit 140. One of the control parameters $PR_P$ and $PR_I$ may be the magnitude of the current input, and the other may be the propagation delay of the delay chain.

In operation, the PFD circuit 110 is activated to detect a difference in phase and frequency between the reference clock $CK_{REF}$ and the feedback clock $CK_{FB}$, and accordingly generate the control signal $CS_P$ and the control signal $CS_I$. The digital code generator circuit 120 may perform digital signal processing operations upon the control signal $CS_I$ to generate the digital code $DC_I$, which can be provided for coarse tuning the frequency of the output clock $CK_{OUT}$ in a digital manner. The control signal $CS_P$ can be provided for fine tuning the frequency of the output clock $CK_{OUT}$ in an analog manner. With the use of coarse tuning and fine tuning of the frequency of the output clock $CK_{OUT}$, the PLL circuit 100 may achieve a wide tuning range and low power consumption.

Additionally, the frequency divider 130 may update the feedback clock $CK_{FB}$ according to the output clock $CK_{OUT}$. The PFD circuit 110 may detect the difference in phase and frequency between the reference clock $CK_{REF}$ and the feedback clock $CK_{FB}$ to update the control signal $CS_P$ and the control signal $CS_I$. The PLL circuit 100 can be considered operating in a PLL mode where the output clock $CK_{OUT}$ is locked according to the reference clock $CK_{REF}$. The frequency of the output clock $CK_{OUT}$, generated when the PLL circuit 100 has locked onto the reference clock $CK_{REF}$, can be adjusted in response to the division factor N.

It is worth noting that the PLL circuit 100 may operate in an oscillator mode where the oscillator circuit 140 can act as a free-running oscillator. For example, the PFD circuit 110 may be disabled in the oscillator mode. The digital code generator circuit 120 may generate the digital code $DC_I$ according to a digital code $DC_T$ provided by a controller 150, rather than the control signal $CS_I$ outputted from the PFD circuit 110. The controller 150 may be included in or disposed outside the PLL circuit 100. The oscillator circuit 140 can generate the output clock $CK_{OUT}$ without the use of the control signal $CS_P$ outputted from the PFD circuit 110.

In the present embodiment, the digital code generator circuit 120 may include a processing circuit 124 and a multiplexer 128. The processing circuit 124, coupled to the PFD circuit 110, can be configured to process the control signal $CS_I$ to generate a digital code $DC_L$. For example, the processing circuit 124 may perform digital loop filtering operations, or other types of digital signal processing operations, upon the control signal $CS_I$ to generate the digital code $DC_L$. The multiplexer 128, coupled to the processing circuit 124 and the oscillator circuit 140, can be configured to select one of the digital code $DC_L$ and the digital code $DC_T$, and output the selected one of the digital code $DC_L$ and the digital code $DC_T$ to provide the digital code $DC_I$. When the multiplexer 128 is configured to select the digital code $DC_T$, the PFD circuit 110 can be disabled such that the oscillator circuit 140 can act as a free-running oscillator.

The digital code $DC_T$ can be obtained using clock trimming. The reference clock $CK_{REF}$ can be used to trim the frequency of the output clock $CK_{OUT}$ to a target frequency. For example, when the PLL circuit 100 operates in a PLL mode, the multiplexer 128 is configured to select the digital code $DC_L$ as the digital code $DC_I$. The controller 150, coupled to the oscillator circuit 140 and the multiplexer 128, can be configured to store a code value of the digital code $DC_I$ which is generated when the feedback clock $CK_{FB}$ is locked to the reference clock $CK_{REF}$. When the feedback clock $CK_{FB}$ is locked to the reference clock $CK_{REF}$, the frequency of the clock output $CK_{OUT}$ serves as the target frequency, which can be adjusted in response to the division factor N. The stored code value of the digital code $DC_I$ serves as a trim value corresponding to the target frequency. When the PLL circuit 100 operates in an oscillator mode, the multiplexer 128 is configured to select the digital code $DC_T$ as the digital code $DC_I$. The controller 150 can be configured to generate the digital code $DC_T$ having a code value equal to the stored code value. As a result, the oscillator circuit 140 can act as a free-running oscillator which can generate the output clock $CK_{OUT}$ at the target frequency. In addition, as the free-running oscillator implemented using the oscillator circuit 140 is controlled by the digital code $DC_T$, the PLL circuit 100 operating in oscillator mode can exhibit high immunity against voltage and temperature variations.

With the use of the proposed PLL control scheme, a PLL circuit can utilize a hybrid control oscillator and a hybrid PFD circuit to achieve low power consumption during phase-locking operations. Additionally, or alternatively, a PLL circuit can implement a free-running digitally controlled oscillator which exhibits high immunity against voltage and temperature variations. As a result, the proposed PLL control scheme can implement a dual mode PLL circuit, which can not only be applicable to artificial intelligence, IoT and other computationally-intensive applications, but also save circuit area and reduce manufacturing costs.

To facilitate understanding of the present disclosure, some embodiments are given as follows for further description of the proposed PLL control scheme. Those skilled in the art should appreciate that other embodiments employing the architecture shown in FIG. 1 are also within the contemplated scope of the present disclosure.

FIG. 2 illustrates an implementation of the PFD circuit 110 shown in FIG. 1 in accordance with some embodiments of the present disclosure. The PFD circuit 210 includes, but is not limited to, a plurality of detectors 212 and 214. The detector 212 is configured to receive the reference clock $CK_{REF}$ and the feedback clock $CK_{FB}$ to generate the control signal $CS_P$, which can indicate a phase relationship between the reference clock $CK_{REF}$ and the feedback clock $CK_{FB}$. By way of example but not limitation, the pulse width of the control signal $CS_P$ may change in response to a magnitude of a phase difference between the reference clock $CK_{REF}$ and the feedback clock $CK_{FB}$, thereby indicating the phase relationship between the reference clock $CK_{REF}$ and the feedback clock $CK_{FB}$.

The detector 214 is configured to receive the reference clock $CK_{REF}$ and the feedback clock $CK_{FB}$ to generate the control signal $CS_I$, which can indicate whether the feedback clock $CK_{FB}$ is running faster or slower than the reference clock $CK_{REF}$. By way of example but not limitation, the detector 214 can be configured to detect a time interval between the reference clock $CK_{REF}$ and the feedback clock $CK_{FB}$ to thereby generate the control signal $CS_I$, which is a digital representation of the time interval and has a pulse width equal to a clock cycle of the reference clock $CK_{REF}$. The control signal $CS_I$ may be a digital signal which can indicate a frequency relationship between the reference clock $CK_{REF}$ and the feedback clock $CK_{FB}$. As another example, the control signal $CS_I$ may be a one-bit digital signal which can indicate a sign of a phase difference between the reference clock $CK_{REF}$ and the feedback clock $CK_{FB}$.

FIG. 3A and FIG. 3B illustrate some implementations of the PFD circuit 210 shown in FIG. 2 in accordance with some embodiments of the present disclosure. Referring firstly to FIG. 3A, a PFD 312 and a time-to-digital converter (TDC) 314A are used to implement the detector 212 and the detector 214 shown in FIG. 2, respectively. In the present embodiment, the PFD 312 is configured to generate a two-bit digital signal, which includes a plurality of pulse signals implemented using an up signal UP and a down signal DN to indicate a phase relationship between the reference clock $CK_{REF}$ and the feedback clock $CK_{FB}$. For example, the PFD 312 may generate the up signal UP with a predetermined logic level when the feedback clock $CK_{FB}$ lags the reference clock $CK_{REF}$, wherein a pulse width of the up signal UP changes in response to a magnitude of a phase difference between the reference clock $CK_{REF}$ and the feedback clock $CK_{FB}$. As another example, the PFD 312 may generate the down signal DN with a predetermined logic level when the feedback clock $CK_{FB}$ leads the reference clock $CK_{REF}$, wherein a pulse width of the down signal DN changes in response to a magnitude of a phase difference between the reference clock $CK_{REF}$ and the feedback clock $CK_{FB}$.

The TDC 314A is configured to detect a time interval between the reference clock $CK_{REF}$ and the feedback clock $CK_{FB}$. As a result, the control signal $CS_I$, a digital representation of the time interval, can indicate whether the feedback clock $CK_{FB}$ is running faster or slower than the reference clock $CK_{REF}$. For example, when the feedback clock $CK_{FB}$ lags or runs slower than the reference clock $CK_{REF}$, the control signal $CS_I$ may have a bit pattern. When the feedback clock $CK_{FB}$ leads or runs faster than the reference clock $CK_{REF}$, the control signal $CS_I$ may have another bit pattern.

Referring to FIG. 3B, the PFD 312 shown in FIG. 3A and a bang-bang phase detector (!!PD) 314B are used to implement the detector 212 and the detector 214 shown in FIG. 2, respectively. In the present embodiment, the !!PD 314B is configured to receive the reference clock $CK_{REF}$ and the feedback clock $CK_{FB}$ to generate the control signal $CS_I$, which is a one-bit digital signal indicating a sign of a phase difference between the reference clock $CK_{REF}$ and the feedback clock $CK_{FB}$. The !!PD 314B can act as a one-bit TDC. For example, the !!PD 314B may generate the control signal $CS_I$ with a predetermined logic level when the feedback clock $CK_{FB}$ lags or runs slower than the reference clock $CK_{REF}$, wherein a pulse width of the control signal $CS_I$ is equal to a clock cycle of the reference clock $CK_{REF}$. As another example, the !!PD 314B may generate the control signal $CS_I$ with another predetermined logic level when the feedback clock $CK_{FB}$ leads or runs faster than the reference clock $CK_{REF}$, wherein a pulse width of the control signal $CS_I$ is equal to the clock cycle of the reference clock $CK_{REF}$.

In some embodiments, the !!PD 314B may be implemented using a D-type flip-flop. For example, the reference clock $CK_{REF}$ and the feedback clock $CK_{FB}$ may be inputted to a data input and a clock input of the D-type flip-flop, respectively. The control signal $CS_I$ may be outputted from a data output of the D-type flip-flop.

Figure 4:
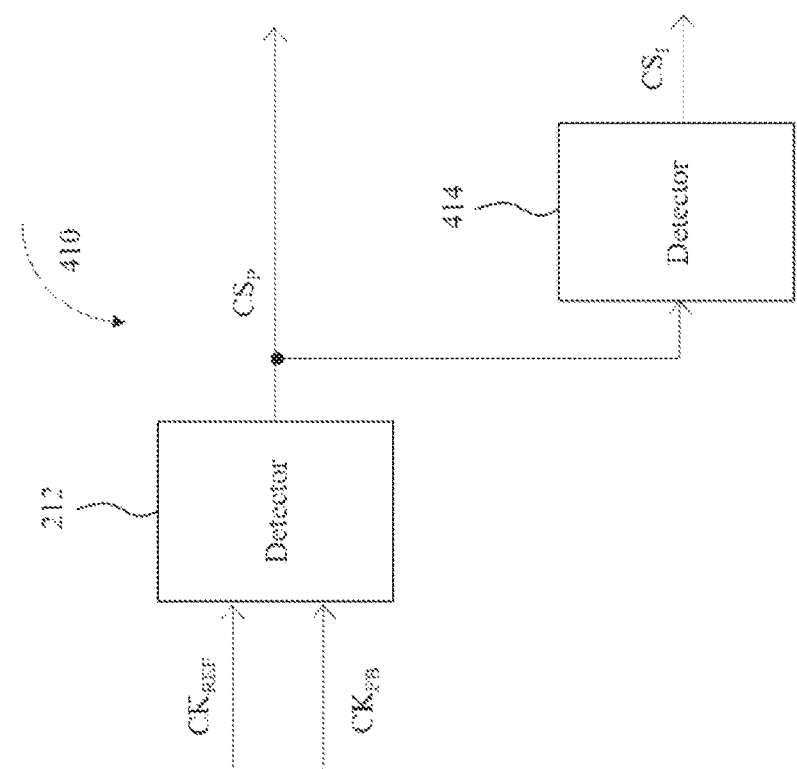
FIG. 4 illustrates another implementation of the phase frequency detector circuit shown in FIG. 1 in accordance with some embodiments of the present disclosure.

FIG. 4 illustrates another implementation of the PFD circuit 110 shown in FIG. 1 in accordance with some embodiments of the present disclosure. The structure of the PFD circuit 410 is similar/identical to the structure of the PFD circuit 210 shown in FIG. 2 except that the control signal $CS_I$ is generated according to the control signal $CS_P$. In the present embodiment, the detector 414, coupled to the detector 212, is configured to receive the control signal $CS_P$ to generate the control signal $CS_I$. By way of example but not limitation, when the control signal $CS_P$ can indicate a phase relationship between the reference clock $CK_{REF}$ and the feedback clock $CK_{FB}$, the detector 414 may process the control signal $CS_P$ to produce the control signal $CS_I$ indicative of whether the feedback clock $CK_{FB}$ is running faster or slower than the reference clock $CK_{REF}$.

Figure 5:
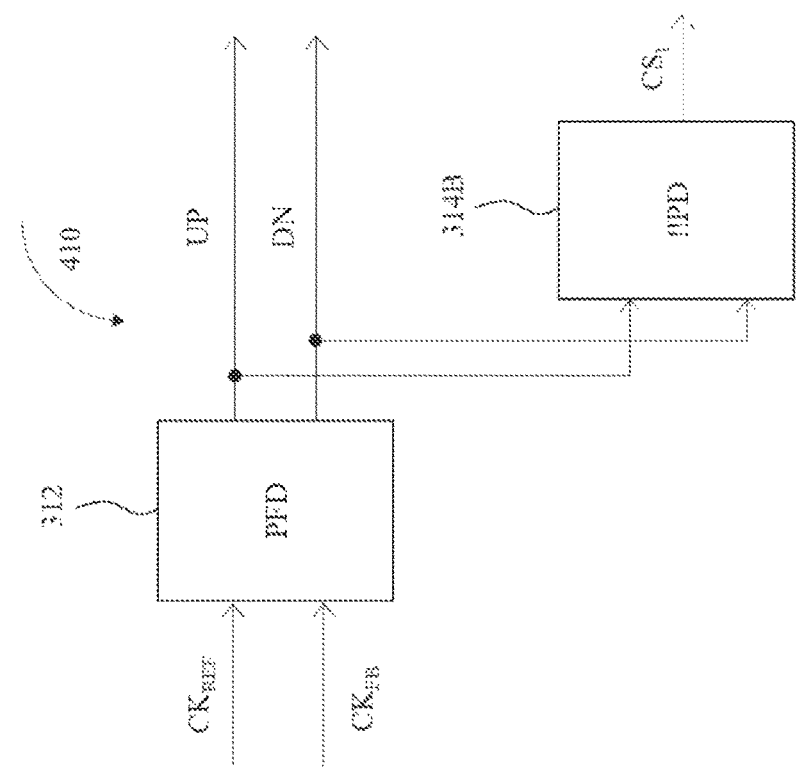
FIG. 5 illustrates an implementations of the phase frequency detector circuit shown in FIG. 4 in accordance with some embodiments of the present disclosure.

FIG. 5 illustrates an implementation of the PFD circuit 410 shown in FIG. 4 in accordance with some embodiments of the present disclosure. In the present embodiment, the PFD 312 and the !!PD 314B shown in FIG. 3B are used to implement the PFD circuit 410. The !!PD 314B, coupled to the PFD 312, can be configured to receive the up signal UP and the down signal DN to generate the control signal $CS_I$. The order of occurrence of the up signal UP and the down signal DN can be determined according to a phase relationship between the reference clock $CK_{REF}$ and the feedback clock $CK_{FB}$. The control signal $CS_I$ may be a one-bit digital signal indicating a sign of a phase difference between the reference clock $CK_{REF}$ and the feedback clock $CK_{FB}$. For example, the !!PD 314B may generate the control signal $CS_I$ with a predetermined logic level when the feedback clock $CK_{FB}$ lags or runs slower than the reference clock $CK_{REF}$. As another example, the !!PD 314B may generate the control signal $CS_I$ with another predetermined logic level when the feedback clock $CK_{FB}$ leads or runs faster than the reference clock $CK_{REF}$.

The circuit structures described above are provided for illustrative purposes, and are not intended to limit the scope of the present disclosure. In some embodiments, the detector 212 shown in FIG. 2 or FIG. 4 can be implemented using a phase detector capable of generating an up signal and a down signal. In some embodiments, the detector 414 shown in FIG. 4 can be implemented using a TDC. For example, the !!PD 314B shown in FIG. 5 may be replaced with the TDC 314A shown in FIG. 3A. Such variations are contemplated as falling within the scope of the present disclosure.

Figure 6:
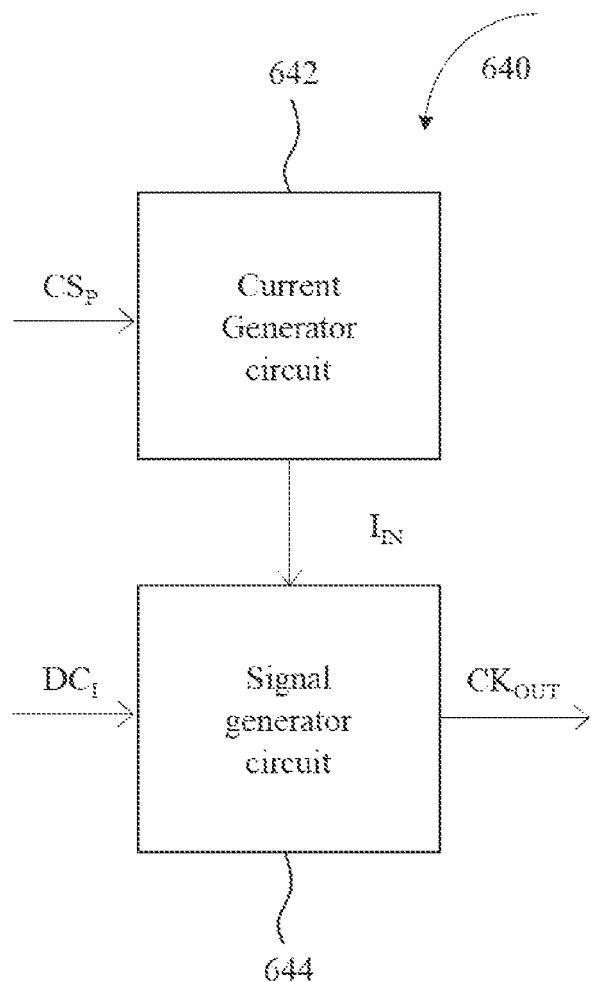
FIG. 6 illustrates an implementation of the oscillator circuit shown in FIG. 1 in accordance with some embodiments of the present disclosure.

FIG. 6 illustrates an implementation of the oscillator circuit 140 shown in FIG. 1 in accordance with some embodiments of the present disclosure. The oscillator circuit 640 includes, but is not limited to, a current generator circuit 642 and a signal generator circuit 644. The current generator circuit 642 is configured to generate a current input $I_{IN}$ according to the control signal $CS_P$. The control parameter $PR_P$ of the oscillator circuit 140 shown in FIG. 1 can be implemented using a current input $I_{IN}$ provided by the current generator circuit 642.

The signal generator circuit 644, coupled to the current generator circuit 642, is configured to enable a signal transmission path according to the digital code $DC_I$. Also, the signal generator circuit 644 is configured to generate the output clock $CK_{OUT}$ by allowing the current input $I_{IN}$ to flow through the signal transmission path. The control parameter $PR_I$ of the oscillator circuit 140 shown in FIG. 1 may implemented using a control parameter associated the signal transmission path. A frequency of the output clock $CK_{OUT}$ can be adjusted in response to the current input $I_{IN}$ and an electrical characteristic of the signal transmission path.

By way of example but not limitation, the oscillator circuit 640 may be implemented using a relaxation oscillator, whose output frequency may be determined according to the current input $I_{IN}$ and capacitance of the signal transmission path. The control parameter $PR_I$ of the oscillator circuit 140 shown in FIG. 1 is implemented using the capacitance of the signal transmission path enabled by the signal generator circuit 644. By adjusting at least one of the current input $I_{IN}$ and the capacitance of the signal transmission path through which the current input $I_{IN}$ flows, the oscillator circuit 640 can adjust the frequency of the output clock $CK_{OUT}$. As another example, the oscillator circuit 640 may be implemented using a ring oscillator, whose output frequency may be determined according to the current input $I_{IN}$ and a propagation delay of the signal transmission path. The control parameter $PR_I$ of the oscillator circuit 140 shown in FIG. 1 is implemented using the propagation delay of the signal transmission path enabled by the signal generator circuit 644. By adjusting at least one of the current input $I_{IN}$ and the propagation delay of the signal transmission path through which the current input $I_{IN}$ flows, the oscillator circuit 640 can adjust the frequency of the output clock $CK_{OUT}$.

Figure 7:
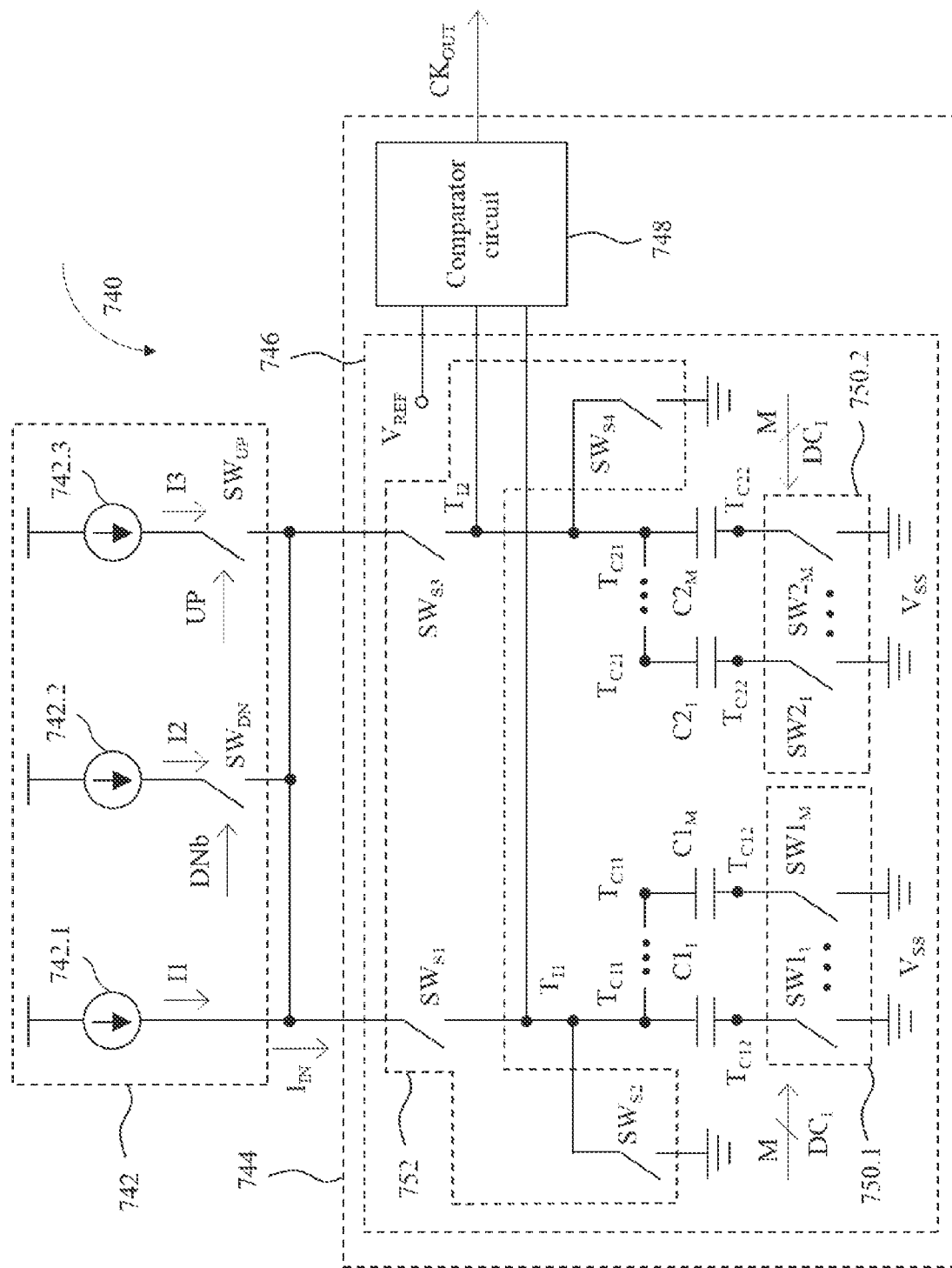
FIG. 7 illustrates an implementation of the oscillator circuit shown in FIG. 6 in accordance with some embodiments of the present disclosure.

FIG. 7 illustrates an implementation of the oscillator circuit 640 shown in FIG. 6 in accordance with some embodiments of the present disclosure. The oscillator circuit 740 includes a current generator circuit 742 and a signal generator circuit 744, which can represent embodiments of the current generator circuit 642 and the signal generator circuit 644 shown in FIG. 6, respectively. In the present embodiment, the oscillator circuit 740 may be implemented using a relaxation oscillator. The control parameter $PR_P$ of the oscillator circuit 140 shown in FIG. 1 can be implemented using the current input $I_{IN}$ provided by the current generator circuit 742, and the control parameter $PR_I$ of the oscillator circuit 140 shown in FIG. 1 can be implemented using capacitance of a signal transmission path provided by the signal generator circuit 744. The frequency of the output clock $CK_{OUT}$ is determined at least according to the current input $I_{IN}$ and the capacitance of the signal transmission path.

The control signal $CS_P$ inputted to the current generator circuit 742 may include a set of error signals indicating a phase difference between the reference clock $CK_{REF}$ and the feedback clock $CK_{FB}$ shown in FIG. 1, wherein the set of error signals includes the up signal UP and the down signal DN described above. The current generator circuit 742 includes, but is not limited to a plurality of current sources 742.1-742.3. The current source 742.1 is configured to provide a current I1 of the current input $I_{IN}$. The current source 742.2 is selectively coupled to the signal generator circuit 744 according to the down signal DN. When coupled to the signal generator circuit 744, the current source 742.2 is configured to provide a current I2 of the current input $I_{IN}$. Similarly, the current source 742.3 is selectively coupled to the signal generator circuit 744 according to the up signal UP. When coupled to the signal generator circuit 744, the current source 742.3 is configured to provide a current I3 of the current input $I_{IN}$. The current I2 provided by the current source 742.2 and the current I3 provided by the current source 742.3 may be at a same current level.

By way of example but not limitation, the current generator circuit 742 may further include a plurality of switches $SW_{UP}$ and $SW_{DN}$, which are controlled by the up signal UP and an inverted signal DNb of the down signal DN respectively. When the up signal UP is at a logic high level and the down signal DN is at a logic low level, each of the switches $SW_{UP}$ and $SW_{DN}$ is turned on. Each of the current I2 and the current I3 is provided to the signal generator circuit 744. When the up signal UP is at a logic low level and the down signal DN is at a logic high level, each of the switches $SW_{UP}$ and $SW_{DN}$ is turned off. Each of the current source 742.2 and the current source 742.3 is uncoupled from the signal generator circuit 744.

The signal generator circuit 744 includes, but is not limited to, a capacitor circuit 746 and a comparator circuit 748. The capacitor circuit 746 includes a plurality of input terminals $T_{I1}$ and $T_{I2}$, which are alternately coupled to the current generator circuit 742. The capacitor circuit 746 can be configured to provide a signal transmission path according to the digital code $DC_I$. Capacitance of the signal transmission path, serving as an embodiment of the control parameter $PR_I$ shown in FIG. 1, can be determined according to the digital code $DC_I$. It is worth noting that the frequency of the output clock $CK_{OUT}$ is proportional to the current input $I_{IN}$ divided by the capacitance of the signal transmission path. As the current input $I_{IN}$ and the capacitance of the signal transmission path are different types of electrical parameters, and controlled by the control signal $CS_P$ and the digital code $DC_I$ respectively, the oscillator circuit 740 can adjust the frequency of the output clock $CK_{OUT}$ with the use of a hybrid control scheme.

The capacitor circuit 746 may further include, but is not limited to, M capacitors $C1_1$-$C1_M$, M capacitors $C2_1$-$C2_M$, and a plurality of switch circuits 750.1 and 750.2, where M is an integer greater than one. A connection terminal $T_{C11}$ of each of the M capacitors $C1_1$-$C1_M$ is selectively coupled to the current generator circuit 742 through the input terminal $T_{I1}$. A connection terminal $T_{C21}$ of each of the M capacitors $C2_1$-$C2_M$ is selectively coupled to the current generator circuit 742 through the input terminal $T_{I2}$.

The switch circuit 750.1 is configured to selectively couple a reference voltage $V_{SS}$ to M connection terminals $T_{C12}$ of the M capacitors $C1_1$-$C1_M$ according to the digital code $DC_I$. The reference voltage $V_{SS}$ can be implemented using a ground voltage. The number of connection terminals coupled to the reference voltage $V_{SS}$ through the switch circuit 750.1 can be determined according to the code value of the digital code $DC_I$. By way of example but not limitation, the switch circuit 750.1 may include M switches $SW1_1$-$SW1_M$, which can be controlled by M bits of the digital code $DC_I$ respectively. Each of the M switches $SW1_1$-$SW1_M$ is selectively coupled between the reference voltage $V_{SS}$ and a corresponding connection terminal $T_{C12}$ according to a corresponding bit of the M bits.

Similarly, the switch circuit 750.2 is configured to selectively couple the reference voltage $V_{SS}$ to M connection terminals $T_{C22}$ of the M capacitors $C2_1$-$C2_M$ according to the digital code $DC_I$. The number of connection terminals coupled to the reference voltage $V_{SS}$ through the switch circuit 750.2 can be determined according to the code value of the digital code $DC_I$. By way of example but not limitation, the switch circuit 750.2 may include M switches $SW2_1$-$SW2_M$, which can be controlled by M bits of the digital code $DC_I$ respectively. Each of the M switches $SW2_1$-$SW2_M$ is selectively coupled between the reference voltage $V_{SS}$ and a corresponding connection terminal $T_{C22}$ according to a corresponding bit of the M bits. In some embodiments, the number of connection terminals coupled to the reference voltage $V_{SS}$ through the switch circuit 750.2 may be equal to the number of connection terminals coupled to the reference voltage $V_{SS}$ through the switch circuit 750.1.

In the present embodiment, the capacitor circuit 746 may further include a switch circuit 752, which can be configured to couple the current generator circuit 742 alternately to the input terminal $T_{I1}$ and the input terminal $T_{I2}$. When one of the input terminal $T_{I1}$ and the input terminal $T_{I2}$ is coupled to the current generator circuit 742, the other of the input terminal $T_{I1}$ and the input terminal $T_{I2}$ is coupled to the reference voltage $V_{SS}$. In the present embodiment, the switch circuit 752 can be controlled according to the output clock $CK_{OUT}$. When the output clock $CK_{OUT}$ is at a logic high level, the switch circuit 752 is configured to couple the input terminal $T_{I1}$ to the current generator circuit 742, and couple the input terminal $T_{I2}$ to the reference voltage $V_{SS}$. When the output clock $CK_{OUT}$ is at a logic low level, the switch circuit 752 is configured to couple the input terminal $T_{I2}$ to the current generator circuit 742, and couple the input terminal $T_{I1}$ to the reference voltage $V_{SS}$.

For example, the switch circuit 752 may include a plurality of switches $SW_{S1}$-$SW_{S4}$. The switches $SW_{S1}$ and $SW_{S4}$ can be controlled by the output clock $CK_{OUT}$, while switches $SW_{S2}$ and $SW_{S3}$ can be controlled by an inverted signal of the output clock $CK_{OUT}$. When the switch $SW_{S1}$ is turned on, the switches $SW_{S2}$ and $SW_{S3}$ are turned off, and the switch $SW_{S4}$ is turned on. When the switch $SW_{S1}$ is turned off, the switches $SW_{S2}$ and $SW_{S3}$ are turned on, and the switch $SW_{S4}$ is turned off.

The comparator circuit 748, coupled to the input terminals $T_{I1}$ and $T_{I2}$, is configured to generate the output clock $CK_{OUT}$ according to a signal level at the input terminal $T_{I1}$ and a signal level at the input terminal $T_{I2}$. By way of example but not limitation, the comparator circuit 746 can be configured to generate the output clock signal $CK_{OUT}$ by comparing each of the signal level at the input terminal $T_{I1}$ and the signal level at the input terminal $T_{I2}$ with a signal level of a reference voltage $V_{REF}$.

In operation, when the output clock $CK_{OUT}$ is at a logic high level, the switches $SW_{S1}$ and $SW_{S4}$ are turned on, and the switches $SW_{S2}$ and $SW_{S3}$ are turned off. The current input $I_{IN}$ flows through a signal transmission path enabled according to the digital code $DC_I$. The signal transmission path is implemented using at least a portion of the M capacitors $C1_1$-$C1_M$, wherein each capacitor of at least the portion of the M capacitors $C1_1$-$C1_M$ is coupled between the input terminal $T_{I1}$ and the reference voltage $V_{SS}$ according to a corresponding bit of the digital code $DC_I$, thereby providing a charging path. The input terminal $T_{I2}$ is coupled to the reference voltage $V_{SS}$. When a signal level at the input terminal $T_{I1}$ is greater than the signal level of the reference voltage $V_{REF}$, the output clock $CK_{OUT}$ may transition to a logic low level. Next, the switches $SW_{S1}$ and $SW_{S4}$ are turned off, and the switches $SW_{S2}$ and $SW_{S3}$ are turned on. The current input $I_{IN}$ flows through a signal transmission path enabled according to the digital code $DC_I$, wherein the signal transmission path is implemented using at least a portion of the M capacitors $C2_1$-$C2_M$. Each capacitor of at least the portion of the M capacitors $C2_1$-$C2_M$ is coupled between the input terminal $T_{I2}$ and the reference voltage $V_{SS}$ according to a corresponding bit of the digital code $DC_I$, thereby providing a charging path. The input terminal $T_{I1}$ is coupled to the reference voltage $V_{SS}$. When a signal level at the input terminal $T_{I2}$ is greater than the reference voltage $V_{REF}$, the output clock $CK_{OUT}$ may transition back to the logic high level.

Based on the operation described above, an oscillating signal, i.e. the output clock $CK_{OUT}$, can be generated accordingly. The frequency of the oscillating signal can be adjusted in response to capacitance of a signal transmission path, which is determined according to the digital code $DC_I$.

Additionally, the current generator circuit 742 may speed up or slow down the charging operation of the capacitor circuit 746 according to the up signal UP and the inverted signal DNb. For example, when each of the up signal UP and the inverted signal DNb is at a logic high level, the current generator circuit 742 may increase the magnitude of current input $I_{IN}$, thereby speeding up the charging operation of the capacitor circuit 746 and increasing the frequency of the output clock $CK_{OUT}$. When each of the up signal UP and the inverted signal DNb is at a logic low level, the current generator circuit 742 may decrease the magnitude of current input $I_{IN}$, thereby slowing down the charging operation of the capacitor circuit 746 and decreasing the frequency of the output clock $CK_{OUT}$. With the use of a hybrid control scheme, the oscillator circuit 740 can achieve a wide tuning range and low power consumption.

Figure 8:
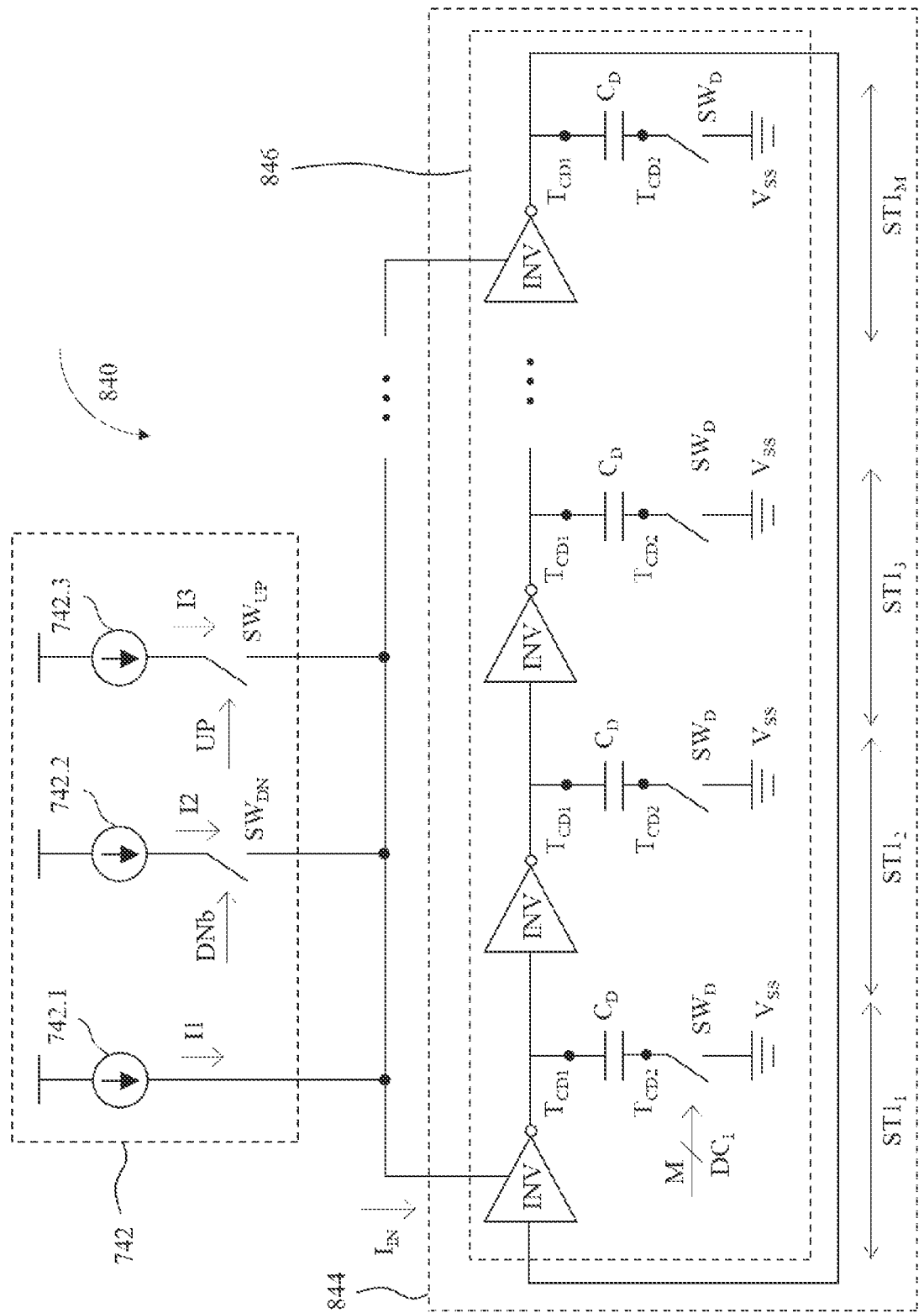
FIG. 8 illustrates another implementation of the oscillator circuit shown in FIG. 6 in accordance with some embodiments of the present disclosure.

FIG. 8 illustrates another implementation of the oscillator circuit 640 shown in FIG. 6 in accordance with some embodiments of the present disclosure. The structure of the oscillator circuit 840 is similar/identical to that of the oscillator circuit 740 shown in FIG. 7 except for the signal generator circuit 844. In the present embodiment, the oscillator circuit 840 may be implemented using a ring oscillator. The signal generator circuit 844 includes a delay chain 846 supplied by the current input $I_{IN}$. The delay chain 846 is configured to provide a signal transmission path according to the digital code $DC_I$, and generate the output clock $CK_{OUT}$ according to the current input $I_{IN}$ and a propagation delay of the signal transmission path. The propagation delay is determined according to the digital code $DC_I$.

The delay chain 846 may include M delay stages $ST1_1$-$ST1_M$ connected in series. The M delay stages $ST1_1$-$ST1_M$ are controlled by M bits of the digital code $DC_I$, respectively, to provide the signal transmission path. In the present embodiment, each delay stage may include an inverter INV, a capacitor $C_D$ and a switch $SW_D$. The inverter INV is supplied by the current input $I_{IN}$. An input of the inverter INV serves as an input of the corresponding delay stage, and an output of the inverter INV serves as an output of the corresponding delay stage. A connection terminal $T_{CD1}$ of the capacitor $C_D$ is coupled to the output of the inverter INV. The switch $SW_D$ is selectively coupled between a connection terminal $T_{CD2}$ of the capacitor $C_D$ and the reference voltage $V_{SS}$, such as a ground voltage, according to a corresponding bit of the M bits of the digital code $DC_I$. As capacitance of each delay stage, controlled by a corresponding bit of the M bits of the digital code $DC_I$, can change delay time of the delay stage, the digital code $DC_I$ can be used to control the propagation delay of the delay chain 846. In other words, the control parameter $PR_I$ of the oscillator circuit 140 shown in FIG. 1 can be implemented using the propagation delay or the capacitance provided by the signal generator circuit 844. The frequency of the output clock $CK_{OUT}$ may be proportional to the current input $I_{IN}$ divided by capacitance of the delay chain 846.

As those skilled in the art can understand operation of the oscillator circuit 840 after reading the above paragraphs directed to FIG. 1 through FIG. 7, further description is omitted here for brevity.

Figure 9:
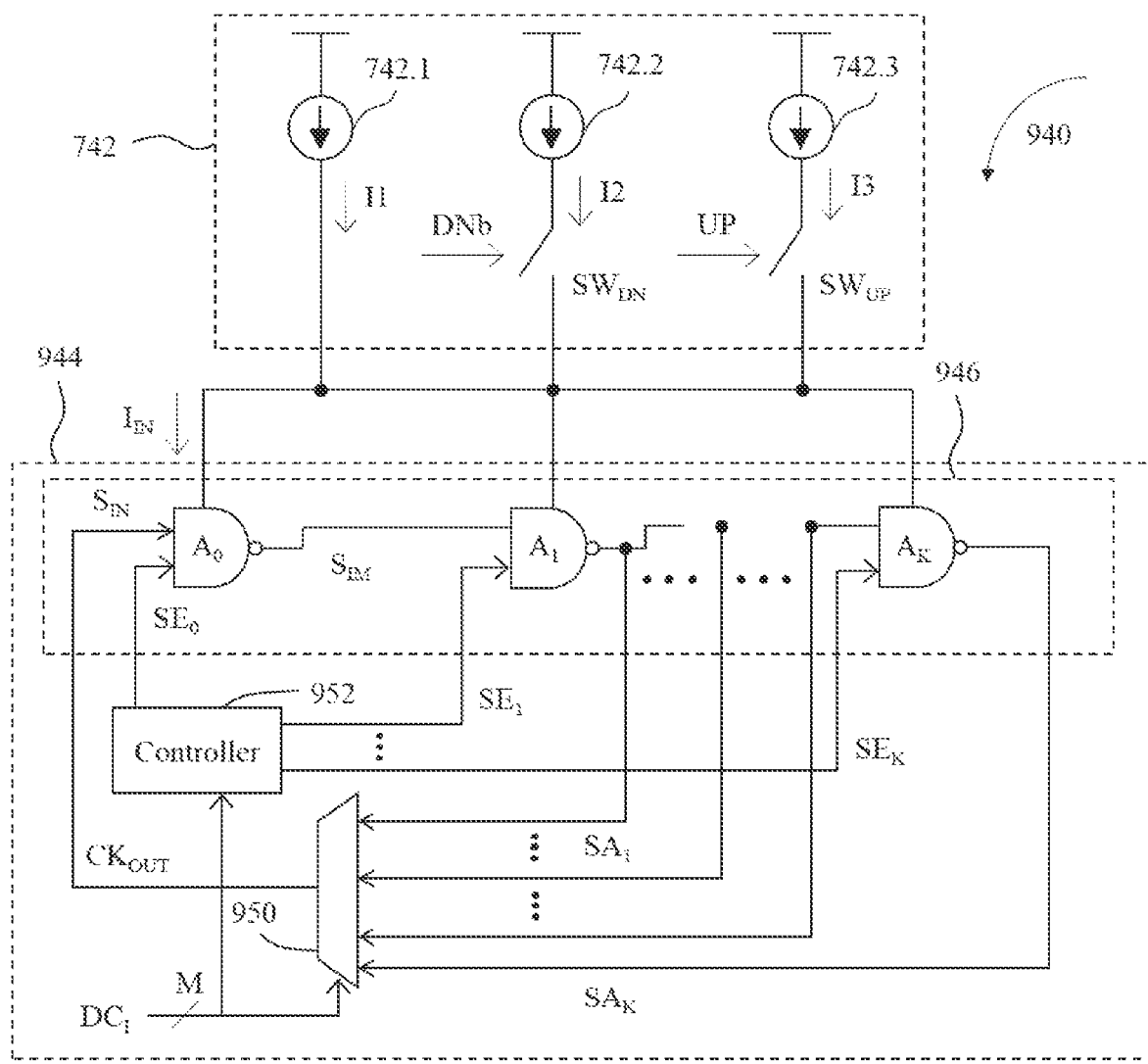
FIG. 9 illustrates another implementation of the oscillator circuit shown in FIG. 6 in accordance with some embodiments of the present disclosure.

FIG. 9 illustrates another implementation of the oscillator circuit 640 shown in FIG. 6 in accordance with some embodiments of the present disclosure. The structure of the oscillator circuit 940 is similar/identical to that of the oscillator circuit 840 shown in FIG. 8 except for the signal generator circuit 944. In the present embodiment, the signal generator circuit 944 includes a delay chain 946 supplied by the current input $I_{IN}$. The delay chain 946 is configured to provide a signal transmission path according to the digital code $DC_I$, and generate the output clock $CK_{OUT}$ according to the current input $I_{IN}$ and a propagation delay of the signal transmission path. The propagation delay is determined according to the digital code $DC_I$.

The delay chain 946 may include a plurality of NAND gates $A_0$-$A_K$ and a multiplexer 950. K is a positive integer. The NAND gate $A_0$ is configured to receive an input signal S $I_N$ and an enable signal $SE_0$ to generate an intermediate signal $S_{IM}$. By way of example but not limitation, the enable signal $SE_0$ may be provided by a control circuit 952 disposed within or outside the oscillator circuit 940. The NAND gates $A_1$-$A_K$ are connected in cascade to receive the intermediate signal S $I_M$ outputted from the NAND gate $A_0$. The NAND gates $A_1$-$A_K$ are enabled by K enable signals $SE_1$-$SE_K$ to generate K output signals $SA_1$-$SA_K$, respectively, wherein an output signal of a NAND gate can serve as an input signal of another NAND gate following the NAND gate. The multiplexer 952, coupled to the NAND gates $A_0$-$A_K$, is configured to enable the signal transmission path by selecting one of the K output signals $SA_1$-$SA_K$ according to the digital code $DC_I$. Also, the multiplexer 952 is configured to output the selected output signal to provide the input signal $S_{IN}$, which serves as the output clock $CK_{OUT}$.

By way of example but not limitation, the control circuit 952 can be configured to generate the K enable signals $SE_1$-$SE_K$ according to M bits of the digital code $DC_I$. When a NAND gate for generating the selected output signal is enabled, each NAND gate preceding the NAND gate is enabled, and each NAND gate following the NAND gate is disabled. In some embodiments, K may be equal to or less than two to the power of M. In some embodiments, K may be equal to M. As one of possible signal transmission paths can be selected using the digital code $DC_I$, the digital code $DC_I$ can be used to control the propagation delay of the delay chain 946. In other words, the control parameter $PR_I$ of the oscillator circuit 140 shown in FIG. 1 can be implemented using the propagation delay provided by the signal generator circuit 944. The frequency of the output clock $CK_{OUT}$ may be proportional to the current input $I_{IN}$ and the propagation delay provided by the signal generator circuit 944.

As those skilled in the art can understand operation of the oscillator circuit 940 after reading the above paragraphs directed to FIG. 1 through FIG. 8, further description is omitted here for brevity.

The above circuit implementations are provided for illustrative purposes, and are not intended to limit the scope of the present disclosure. In some embodiments, the oscillator circuit 740 shown in FIG. 7 can be implemented using other relaxation oscillator structures. In some embodiments, the oscillator circuit 840 shown in FIG. 8 and/or the oscillator circuit 940 shown in FIG. 9 can be implemented using other ring oscillator structures. As long as an oscillator circuit can be implemented as a hybrid control oscillator, which has different types of control parameters controlled by different control signals respectively, associated modifications and alternatives fall within the contemplated scope of the present disclosure.

Figure 10:
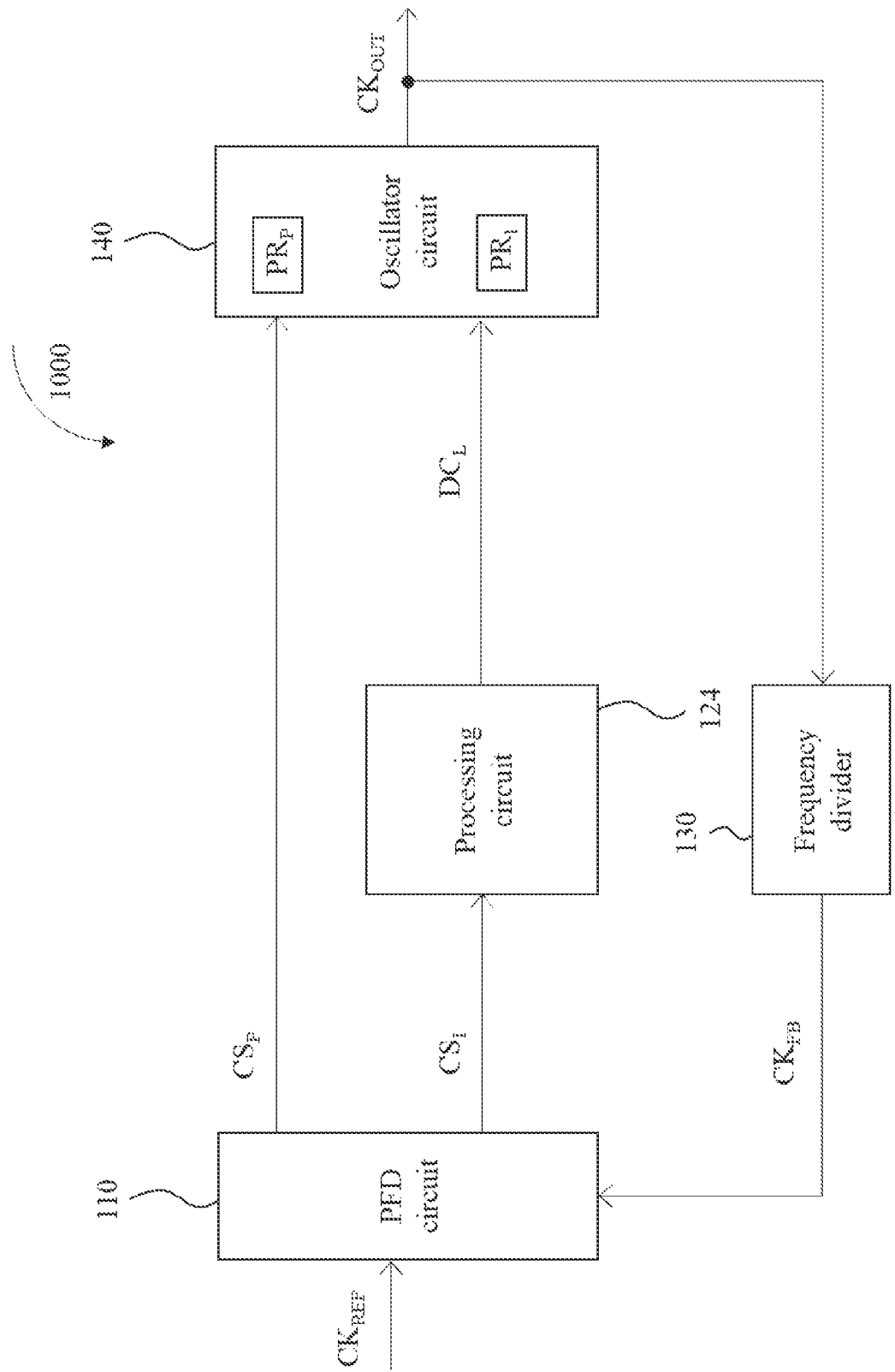
FIG. 10 is a block diagram illustrating an exemplary phase-locked loop circuit in accordance with some embodiments of the present disclosure.

In some embodiments, an oscillator mode provided by the proposed PLL control scheme may be optional. FIG. 10 is a block diagram illustrating an exemplary PLL circuit in accordance with some embodiments of the present disclosure. The structure of the PLL circuit 1000 is similar/identical to that of the PLL circuit 100 shown in FIG. 1 except that the oscillator circuit 140 can receive the control signal $CS_P$ and the digital code $DC_I$ to generate the output clock $CK_{OUT}$. As those skilled in the art can understand operation of the PLL circuit 1000 after reading the above paragraphs directed to FIG. 1 through FIG. 9, further description is omitted here for brevity.

Figure 11:
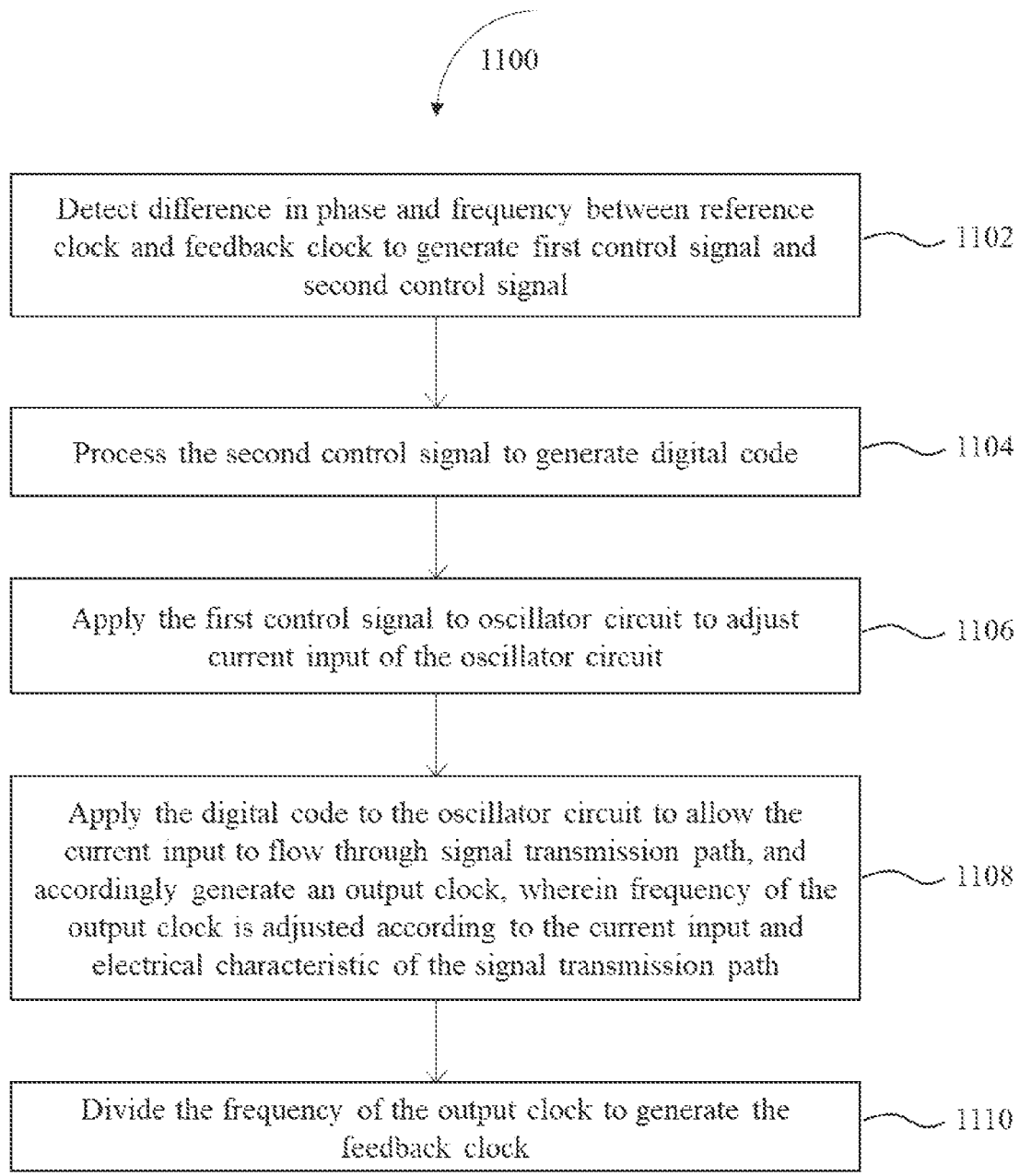
FIG. 11 is a flow chart of a control method of an oscillator circuit in accordance with some embodiments of the present disclosure.

FIG. 11 is a flow chart of a control method of an oscillator circuit in accordance with some embodiments of the present disclosure. The control method 1100 is described with reference to the PLL circuit 100 shown in FIG. 1 for illustrative purposes. In some embodiments, other operations in the control method 1100 can be performed. In some embodiments, operations of the control method 1100 can be performed in a different order and/or vary. In some other embodiments, one or more operations of the control method 1100 may be optional.

At operation 1102, a difference in phase and frequency between a reference clock and a feedback clock is detected to generate a first control signal and a second control signal. For example, the PFD circuit 110 may detect a difference in phase and frequency between the reference clock $CK_{REF}$ and the feedback clock $CK_{FB}$ to generate the control signal $CS_P$ and the control signal $CS_I$.

At operation 1104, the second control signal is processed to generate a digital code. For example, the digital code generator circuit 120 may process the control signal $CS_I$ to generate the digital code $DC_I$.

At operation 1106, the first control signal is applied to the oscillator circuit to adjust a current input of the oscillator circuit. For example, the PFD circuit 110 may apply the control signal $CS_P$ to the oscillator circuit 140 to adjust a current input of the oscillator circuit 140, which may be implemented using the current input $I_{IN}$ shown in FIG. 6.

At operation 1108, the digital code is applied to the oscillator circuit to allow the current input to flow through a signal transmission path. An output clock is generated accordingly, wherein a frequency of the output clock is adjusted according to the current input and an electrical characteristic of the signal transmission path. For example, the digital code generator circuit 120 may apply the digital code $DC_I$ to the oscillator circuit 140 to allow the current input to flow through a signal transmission path. The oscillator circuit 140 can generate the output clock $CK_{OUT}$ accordingly. Consider an example where the oscillator circuit 140 is implemented as the oscillator circuit 740 shown in FIG. 7. The oscillator circuit 740 shown in FIG. 7 can generate the output clock $CK_{OUT}$ according to the current input $I_{IN}$ and capacitance of a signal transmission path, which is provided/enabled according to the digital code $DC_I$.

At operation 1110, dividing the frequency of the output clock to generate the feedback clock. For example, the frequency divider 140 may divide the frequency of the output clock $CK_{OUT}$ to generate the feedback clock $CK_{FB}$.

In some embodiment, after the feedback clock is locked to the reference clock, the control method 1100 may disable generation of the first control signal and the second control signal, and enable the oscillator circuit to operate as a free-running oscillator. For example, after the feedback clock $CK_{FB}$ is locked to the reference clock $CK_{REF}$, the PFD circuit 110 may be disabled. The multiplexer 128 may select the digital code $DC_T$ as the digital code $DC_I$, wherein a code value of the digital code $DC_T$ is equal to a code value of the digital code $DC_I$ generated when the feedback clock $CK_{FB}$ is locked to the reference clock $CK_{REF}$.

As those skilled in the art can appreciate operation of the control method 1100 after reading the above paragraphs directed to FIG. 1 through FIG. 10, further description is omitted here for brevity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase-locked loop (PLL) circuit, comprising:
   a phase frequency detector (PFD) circuit, configured to detect a difference in phase and frequency between a reference clock and a feedback clock to generate a control signal;
   a digital code generator circuit, coupled to the PFD circuit, the digital code generator circuit being configured to receive the control signal, and process the control signal to generate a first digital code;
   a frequency divider, coupled to the PFD circuit, the frequency divider being configured to receive an output clock to generate the feedback clock; and
   an oscillator circuit, coupled to the digital code generator circuit and the frequency divider, the oscillator circuit being configured to receive the first digital code to allow a current input to flow through a signal transmission path of a plurality of signal transmission paths within the oscillator circuit, and accordingly generate the output clock, wherein a frequency of the output clock is adjusted according to the current input and an electrical characteristic of the signal transmission path.

2. The PLL circuit of claim 1, wherein the oscillator circuit comprises:
   a current generator circuit, configured to generate the current input; and
   a signal generator circuit, coupled to the current generator circuit, the signal generator circuit being configured to enable the signal transmission path according to the first digital code, and generate the output clock by allowing the current input to flow through the signal transmission path.

3. The PLL circuit of claim 2, wherein the signal generator circuit comprises:
   a capacitor circuit, having a first input terminal and a second input terminal alternately coupled to the current generator circuit, the capacitor circuit being configured to provide the signal transmission path according to the first digital code, wherein the electrical characteristic is capacitance of the signal transmission path, and the capacitance is determined according to the first digital code; and
   a comparator circuit, coupled to the first input terminal and the second input terminal, the comparator circuit being configured to generate the output clock according to a signal level at the first input terminal and a signal level at the second input terminal.

4. The PLL circuit of claim 3, wherein the capacitor circuit comprises:
   M first capacitors, wherein a first connection terminal of each first capacitor is selectively coupled to the current generator circuit through the first input terminal, M being an integer greater than one;
   a first switch circuit, configured to selectively couple a reference voltage to M second connection terminals of the M first capacitors according to the first digital code, wherein a number of second connection terminals coupled to the reference voltage through the first switch circuit is determined according to a code value of the first digital code;
   M second capacitors, wherein a first connection terminal of each second capacitor is selectively coupled to the current generator circuit through the second input terminal; and
   a second switch circuit, configured to selectively couple the reference voltage to M second connection terminals of the M second capacitors according to the first digital code, wherein a number of second connection terminals coupled to the reference voltage through the second switch circuit is determined according to the code value of the first digital code.

5. The PLL circuit of claim 4, wherein each of the first switch circuit and the second switch circuit comprises:
   M switches, controlled by M bits of the first digital code respectively, wherein each of the M switches is selectively coupled between the reference voltage and a corresponding second connection terminal according to a corresponding bit of the M bits.

6. The PLL circuit of claim 2, wherein the signal generator circuit comprises a delay chain supplied by the current input; the delay chain is configured to provide the signal transmission path according to the first digital code, and generate the output clock according to the current input and a propagation delay of the signal transmission path; the electrical characteristic of the signal transmission path is the propagation delay determined according to the first digital code.

7. The PLL circuit of claim 6, wherein the delay chain comprises M delay stages connected in series, and the M delay stages are controlled by M bits of the first digital code, respectively, to provide the signal transmission path; each delay stage comprises:
   an inverter, supplied by the current input, wherein an input of the inverter serves as an input of the delay stage, and an output of the inverter serves as an output of the delay stage; and
   a capacitor, wherein a first connection terminal of the capacitor is coupled to the output of the inverter; and
   a switch, selectively coupled between a second connection terminal of the capacitor and a reference voltage according to a corresponding bit of the M bits.

8. The PLL circuit of claim 6, wherein the delay chain comprises:
   a first NAND gate, configured to receive an input signal and a first enable signal to generate an intermediate signal;
   K second NAND gates connected in cascade to receive the intermediate signal, the K second NAND gates being enabled by K second enable signals respectively, K being a positive integer; and
   a multiplexer, coupled to the first NAND gate and the K second NAND gates, the multiplexer being configured to enable the signal transmission path by selecting one of K output signals of the K second NAND gates according to the first digital code, and output the selected output signal to provide the input signal, wherein the input signal serves as the output clock.

9. The PLL circuit of claim 8, further comprising:
a control circuit, coupled to the K second NAND gates, the control circuit being configured to generate the K second enable signals according to the first digital code, wherein when a second NAND gate for generating the selected output signal is enabled, each second NAND gate preceding the second NAND gate is enabled, and each second NAND gate following the second NAND gate is disabled.

10. The PLL circuit of claim 1, wherein the digital code generator circuit comprises:
a processing circuit, coupled to the PFD circuit, the processing circuit being configured to process the second control signal to generate a second digital code; and
a multiplexer, coupled to the processing circuit and the oscillator circuit, the multiplexer being configured to select one of the second digital code and a third digital code, and output the selected one of the second digital code and the third digital code to provide the first digital code, wherein when the multiplexer is configured to select the third digital code, the PFD circuit is disabled.

11. The PLL circuit of claim 10, further comprising:
a controller, coupled to the oscillator circuit and the multiplexer, wherein when the multiplexer is configured to select the second digital code, the controller is configured to store a code value of the first digital code generated when the feedback clock is locked to the reference clock; when the multiplexer is configured to select the third digital code, the controller is configured to generate the third digital code having a code value equal to the stored code value.

12. A phase-locked loop (PLL) circuit, comprising:
a phase frequency detector (PFD) circuit, configured to detect a difference in phase and frequency between a reference clock and a feedback clock to generate a control signal;
a processing circuit, coupled to the PFD circuit, the processing circuit being configured to process the control signal to generate a first digital code;
a multiplexer, coupled to the processing circuit, the multiplexer being configured to select one of the first digital code and a second digital code, and output the selected digital code to provide a third digital code, wherein when the multiplexer is configured to select the second digital code, the PFD circuit is disabled;
a frequency divider, coupled to the PFD circuit, the frequency divider being configured to receive an output clock to generate the feedback clock; and
an oscillator circuit, coupled to the multiplexer and the frequency divider, the oscillator circuit being configured to enable a signal transmission path of a plurality of signal transmission paths within the oscillator circuit according to the third digital code, and generate the output clock according to a current input flowing through the signal transmission path and an electrical characteristic of the signal transmission path.

13. The PLL circuit of claim 12, wherein a code value of the second digital code is equal to a code value of the third digital code generated when the feedback clock is locked to the reference clock.

14. The PLL circuit of claim 12, further comprising:
a controller, coupled to the oscillator circuit and the multiplexer, wherein when the multiplexer is configured to select the first digital code, the controller is configured to store a code value of the third digital code generated when the feedback clock is locked to the reference clock; when the multiplexer is configured to select the second digital code, the controller is configured to generate the second digital code having a code value equal to the stored code value.

15. The PLL circuit of claim 12, wherein the oscillator circuit comprises:
a current generator circuit, configured to generate the current input; and
a signal generator circuit, coupled to the current generator circuit, the signal generator circuit being configured to enable the signal transmission path according to the third digital code, and generate the output clock by allowing the current input to flow through the signal transmission path.

16. The PLL circuit of claim 15, wherein the signal generator circuit comprises:
a capacitor circuit, having a first input terminal and a second input terminal alternately coupled to the current generator circuit, the capacitor circuit being configured to provide the signal transmission path according to the third digital code, wherein the electrical characteristic is capacitance of the signal transmission path, and the capacitance is determined according to the third digital code; and
a comparator circuit, coupled to the first input terminal and the second input terminal, the comparator circuit being configured to generate the output clock according to a signal level at the first input terminal and a signal level at the second input terminal.

17. The PLL circuit of claim 16, wherein the capacitor circuit comprises:
M first capacitors, wherein a first connection terminal of each first capacitor is selectively coupled to the current generator circuit through the first input terminal, M being an integer greater than one;
a first switch circuit, configured to selectively couple a reference voltage to M second connection terminals of the M first capacitors according to the third digital code, wherein a number of second connection terminals coupled to the reference voltage through the first switch circuit is determined according to a code value of the third digital code;
M second capacitors, wherein a first connection terminal of each second capacitor is selectively coupled to the current generator circuit through the second input terminal; and
a second switch circuit, configured to selectively couple the reference voltage to M second connection terminals of the M second capacitors according to the third digital code, wherein a number of second connection terminals coupled to the reference voltage through the second switch circuit is determined according to the code value of the third digital code.

18. The PLL circuit of claim 15, wherein the signal generator circuit comprises a delay chain supplied by the current input; the delay chain is configured to provide the signal transmission path according to the third digital code, and generate the output clock according to the current input and a propagation delay of the signal transmission path; the electrical characteristic of the signal transmission path is the propagation delay determined according to the third digital code.

19. The PLL circuit of claim 18, wherein the delay chain comprises M delay stages connected in series, and the M delay stages are controlled by M bits of the third digital code, respectively, to provide the signal transmission path; each delay stage comprises:
- an inverter, supplied by the current input, wherein an input of the inverter serves as an input of the delay stage, and an output of the inverter serves as an output of the delay stage; and
- a capacitor, wherein a first connection terminal of the capacitor is coupled to the output of the inverter; and
- a switch, selectively coupled between a second connection terminal of the capacitor and a reference voltage according to a corresponding bit of the M bits.

20. The PLL circuit of claim 18, wherein the delay chain comprises:
- a first NAND gate, configured to receive an input signal and a first enable signal to generate an intermediate signal;
- K second NAND gates connected in cascade to receive the intermediate signal, the K second NAND gates being enabled by K second enable signals respectively, K being a positive integer; and
- a multiplexer, coupled to the first NAND gate and the K second NAND gates, the multiplexer being configured to enable the signal transmission path by selecting one of K output signals of the K second NAND gates according to the third digital code, and output the selected output signal to provide the input signal, wherein the input signal serves as the output clock.

* * * * *